(12) United States Patent
Di Giandomenico et al.

(10) Patent No.: US 11,115,066 B2
(45) Date of Patent: Sep. 7, 2021

(54) MULTI-PURPOSE RECEIVER CHAIN FOR WIFI APPLICATIONS

(71) Applicant: Intel Corporation, Santa Clara, CA (US)

(72) Inventors: Antonio Di Giandomenico, Villach (AT); Vahur Kampus, Villach (AT); Sergio Walter, Villach (AT); Alexander Kahl, Villach (AT); Steffen Trautmann, Villach (AT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/463,107

(22) PCT Filed: Dec. 22, 2016

(86) PCT No.: PCT/US2016/068264
§ 371 (c)(1),
(2) Date: May 22, 2019

(87) PCT Pub. No.: WO2018/118063
PCT Pub. Date: Jun. 28, 2018

(65) Prior Publication Data
US 2019/0288721 A1    Sep. 19, 2019

(51) Int. Cl.
*H04B 1/40* (2015.01)
*H04B 1/00* (2006.01)
(Continued)

(52) U.S. Cl.
CPC .......... *H04B 1/0067* (2013.01); *H03M 3/464* (2013.01); *H04B 1/40* (2013.01);
(Continued)

(58) Field of Classification Search
CPC ............ H04B 1/00; H04B 1/40; H04B 84/12; H03M 3/00; H03M 3/464
See application file for complete search history.

(56) References Cited

U.S. PATENT DOCUMENTS

| 2004/0002306 A1* | 1/2004 | Haapoja | H04B 1/109 |
| | | | 455/69 |
| 2006/0132341 A1* | 6/2006 | Koh | H03M 3/47 |
| | | | 341/143 |

(Continued)

FOREIGN PATENT DOCUMENTS

| WO | 2015167232 A1 | 11/2015 |
| WO | 2016027134 A1 | 2/2016 |

OTHER PUBLICATIONS

International Search Report and Written Opinion dated Aug. 29, 2017 for PCT Application PCT/US2016/068264.
(Continued)

*Primary Examiner* — Chi Ho A Lee
(74) *Attorney, Agent, or Firm* — 2SPL Patent Attorneys PartG mbB; Yong Beom Hwang

(57) ABSTRACT

An energy-efficient implementation of a WiFi transceiver is proposed in this disclosure. The WiFi transceiver comprises a receive chain comprising a variable receive (Rx) filter circuit and a variable Rx analog-to-digital converter (ADC) circuit. The receive chain is configured to receive a receive signal during a receive mode of operation, having a receive bandwidth associated therewith and receive a transmit signal associated with a transmit chain of the transceiver during a transmit mode of operation, having a transmit bandwidth associated therewith. The WiFi transceiver further comprises a control circuit configured to dynamically adapt a bandwidth of the variable Rx filter and the variable Rx ADC
(Continued)

in the receive chain to the receive bandwidth or to the transmit bandwidth, based on the mode of operation.

15 Claims, 5 Drawing Sheets

(51) Int. Cl.
    *H03M 3/00*            (2006.01)
    *H03G 3/30*             (2006.01)
    *H04W 84/12*          (2009.01)

(52) U.S. Cl.
    CPC ..... *H03G 3/3036* (2013.01); *H03G 2201/103* (2013.01); *H04W 84/12* (2013.01)

(56) References Cited

U.S. PATENT DOCUMENTS

| | | | |
|---|---|---|---|
| 2006/0246942 A1 | 11/2006 | Ramachandran et al. | |
| 2007/0291880 A1 | 12/2007 | Ashkenazi | |
| 2008/0144539 A1* | 6/2008 | Sperlich | H04L 5/1469 370/278 |
| 2010/0137025 A1* | 6/2010 | Tal | H04B 3/32 455/553.1 |
| 2010/0203879 A1* | 8/2010 | Toncich | H04B 1/44 455/422.1 |
| 2012/0071120 A1* | 3/2012 | Pinarello | H03F 3/24 455/127.5 |
| 2014/0152481 A1* | 6/2014 | Dugalleix | H03M 1/06 341/144 |
| 2014/0268391 A1* | 9/2014 | Liao | G11B 20/10046 360/45 |
| 2015/0146765 A1* | 5/2015 | Moffatt | H04B 1/525 375/219 |
| 2015/0180685 A1* | 6/2015 | Noest | H04B 1/10 375/219 |
| 2016/0105299 A1* | 4/2016 | Chee | H03F 1/0205 375/297 |
| 2017/0188264 A1* | 6/2017 | Hwang | H04W 52/362 |

OTHER PUBLICATIONS

"Introducing MulteFire: LTE-like performance with Wi-Fi-like simplicity." OnQ Blog. Qualcomm. Jun. 11, 2015. 6 pages.

"LTE-U Forum: Alcatel-Lucent, Ericsson, LG Electronics, Qualcomm Technologies Inc., Samsung Electornics & Verizons" LTE-U CSAT Procedure TS V1.0 (Oct. 2015). LTE-U Forum. 7 pages.

"Details of DRS design for LAA." Agenda Item: 7.2.3,2,1. Source: ZTE. 3GFP TSG RAN WG1 Meeting #82bis, Malmo, Sweden, Oct. 5-9, 2015. R1-155533. 10 pages.

\* cited by examiner

MULTI-PURPOSE RECEIVER CHAIN FOR WIFI APPLICATIONS

This application is a National Phase entry application of International Patent Application No. PCT/US2016/068264 filed Dec. 22, 2016 entitled "A MULTI-PURPOSE RECEIVER CHAIN FOR WIFI APPLICATIONS in the name of Antonio Di Giandomenico et al. and is hereby incorporated by reference in its entirety.

FIELD

The present disclosure relates to the field of WiFi technology, and more specifically to an apparatus and a method for implementing an efficient and low-power WiFi receiver.

BACKGROUND

With the popularity of WiFi devices, there is an increased need for implementing energy-efficient WiFi systems. While WiFi has become a necessity of modern life, Wi-Fi is also an energy hog, draining batteries of all WiFi connected devices surrounding us. In particular, WiFi receivers (e.g., in mobile phones or laptops) need to scan WiFi signals continuously and since they are normally battery driven, energy efficiency is a very important consideration.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Figure 1:
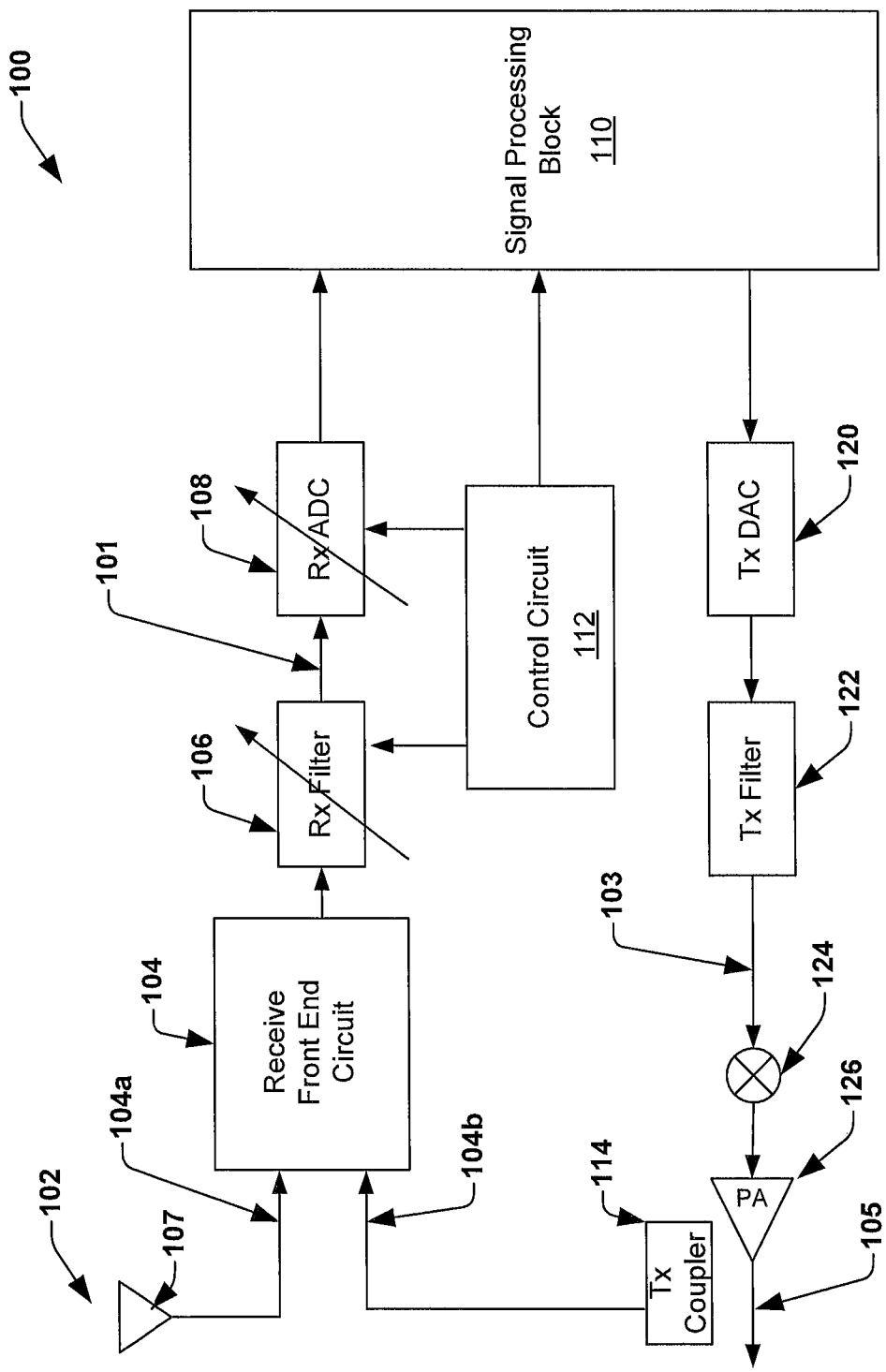
FIG. 1 illustrates a simplified block diagram of a WiFi transceiver, according to one embodiment of the disclosure.

In one embodiment of the disclosure, a WiFi transceiver comprising a receive chain comprising a variable receive (Rx) filter circuit and a variable Rx analog-to-digital converter (ADC) circuit is disclosed. The receive chain is configured to receive a receive signal during a receive mode of operation, having a receive bandwidth associated therewith; and receive a transmit signal associated with a transmit chain of the transceiver during a transmit mode of operation, having a transmit bandwidth associated therewith. The WiFi transceiver further comprises a control circuit configured to dynamically adapt a bandwidth of the variable Rx filter and the variable Rx ADC in the receive chain to the receive bandwidth or to the transmit bandwidth, based on the mode of operation.

In one embodiment of the disclosure, an analog-to-digital converter (ADC) in a receive chain of a WiFi transceiver is disclosed. The ADC comprises a filter circuit configured to receive and filter an analog input signal associated with the receive chain of the WiFi receiver and a flash ADC circuit coupled to an output of the filter circuit and configured to generate a digital output signal based on the analog input signal. Further, the ADC comprises a feedback circuit coupled to the output of the flash ADC circuit and configured to feed back the digital output signal to a feedback path associated with the filter circuit, wherein the filter circuit, the flash ADC circuit and the feedback circuit together has a signal transfer function (STF) and a noise transfer function (NTF) associated therewith. In addition, the ADC comprises an ADC control circuit configured to adjust the STF and NTF, based on a first mode of operation and a second, different mode of operation of the ADC.

In one embodiment of the disclosure, a method for a WiFi transceiver is disclosed. The method comprises receiving a receive signal at a receive chain of the transceiver during a receive mode of operation, having a receive bandwidth associated therewith and receiving a transmit signal associated with a transmit chain of the transceiver at the receive chain of the transceiver during a transmit mode of operation, having a transmit bandwidth associated therewith, wherein the receive chain comprises a variable receive (Rx) filter circuit and a variable Rx analog-to-digital converter (ADC) circuit coupled thereto. The method further comprises dynamically adapting a bandwidth of the variable Rx filter circuit and the variable Rx ADC circuit in the receive chain to the receive bandwidth or to the transmit bandwidth, based on the mode of operation, using a control circuit.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," "circuit" and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising."

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

As indicated above, energy efficiency of WiFi receivers is an important consideration in WiFi systems. A typical WiFi receiver comprises at least three receive signal paths, in order to facilitate the efficient operation of the WiFi receiver. For example, a main receive path configured to receive a receive signal during normal receive operations, a receive signal strength indicator (RSSI) path configured to set an optimal gain of the main receive path, during normal receive operations and a digital pre-distortion (DPD) loopback path configured to perform a DPD calibration of a power amplifier (PA) in a transmit path of the WiFi receiver, during transmit operations. In some embodiments, the main receive path comprises a receive (Rx) filter and a receive (Rx) analog-to-digital converter (ADC). In some embodiments, the Rx filter and the Rx ADC are configured to have a predetermined receive bandwidth, for example, up to 80 MHz in case of WiFi. In some embodiments, the RSSI path comprises an RSSI filter and an RSSI ADC. In some embodiments, the RSSI filter and the RSSI ADC are configured to have a predetermined RSSI bandwidth, for example, a wider bandwidth compared to the receive bandwidth for sensing in-band and out-of-band power. Similarly, in some embodiments, the DPD loopback path comprises a DPD filter and a DPD ADC configured to have a predetermined DPD bandwidth, for example, an ultra-wide bandwidth, around 240 MHz in the case of WiFi.

Since the existing implementations of WiFi receivers include dedicated filters and ADCs in each of their respective receive paths, current implementations of WiFi receivers consumes a lot of area and power. Therefore, in order to implement an energy-efficient WiFi system, an apparatus and a method for a WiFi receiver, that facilitates to implement an energy efficient WiFi system is proposed in this disclosure. In particular, in one embodiment, an apparatus for an energy-efficient WiFi transceiver is disclosed. In some embodiments, the energy-efficient WiFi transceiver disclosed herein has a unified base-band receiver chain comprising a programmable Rx filter and a programmable Rx ADC with programmable bandwidth. In some embodiments, the programmable Rx filter enables to replace the dedicated filters, for example, the Rx filter, the RSSI filter and the DPD filter in the current implementations of the WiFi transceiver. Similarly, in some embodiments, the programmable Rx ADC disclosed herein enables to replace the dedicated ADCs, for example, the Rx ADC, the RSSI ADC and the DPD ADC in the current implementations of the WiFi transceiver.

FIG. 1 illustrates a simplified block diagram of a WiFi transceiver 100, according to one embodiment of the disclosure. The WiFi transceiver 100 comprises a receive chain 101 configured to receive a receive signal 102 during a receive mode of operation, and a transmit chain 103 configured to transmit a transmit signal 105 during a transmit mode of operation. In some embodiments, the receive chain 101 is further configured to receive the transmit signal 105, via a transmit (Tx) coupler 104, during the transmit mode of operation. The receive mode of operation comprises a mode of operation during which the WiFi transceiver 100 is receiving signals and the transmit mode of operation comprises a mode of operation during which the WiFi transceiver 100 is transmitting signals. In typical implementations of the WiFi receiver 100, the receive mode of operation and the transmit mode of operation do not overlap.

In some embodiments, the receive chain 101 has a receive bandwidth associated therewith, during the receive mode of operation and in other embodiments, the receive chain 101 has a transmit bandwidth associated therewith, during the transmit mode of operation. In some embodiments, the transmit bandwidth is different from the receive bandwidth. For example, in some embodiments, the transmit bandwidth is greater than the receive bandwidth or vice versa. The receive chain 101 comprises a receive front end circuit 104, a programmable Rx filter 106 and a programmable Rx ADC 108. In some embodiments, the WiFi transceiver 100 further comprises a control circuit 112 configured to dynamically adapt a bandwidth associated with the programmable Rx filter 106 and the programmable Rx ADC 108 to the receive bandwidth, during the receive mode of operation, and to the transmit bandwidth, during the transmit mode of operation. In some embodiments, the transmit chain 103 comprises a Tx DAC 120, a Tx filter 122, a Tx mixer 124 and a power amplifier 126.

In some embodiments, the WiFi transceiver 100 further comprises a signal processing block 110 configured to process signals associated with the receive chain 101 and the transmit chain 103. In some embodiments, the receive front end circuit 104 comprises a first input path 104a coupled to a receive antenna 107 configured to receive the receive signal 102 during the receive mode of operation. In some embodiments, the receive front end circuit 104 further comprises a second input path 104b coupled to the Tx coupler 114, in order to receive the transmit signal 105 during the transmit mode of operation. In some embodiments, the receive front end circuit 104 is configured to provide the receive signal 102 to the programmable Rx filter 106 during the receive mode of operation. Further, in some embodiments, the receive front end circuit 104 is configured to provide the transmit signal 105 to the programmable Rx filter 106 during the transmit mode of operation.

During the receive mode of operation, in some embodiments, the signal processing block 110 is configured to process the receive signal 102 from the antenna 107 in one instance, and in another instance, the signal processing block 110 is configured to set an optimal gain of the receive chain 101 based on a power of the receive signal 102. In some embodiments, the signal processing block 110 can comprise a power detector circuit (not shown) configured to determine a power associated with the receive chain 101, in order to set the optimal gain of the receive chain 101. During the transmit mode of operation, the signal processing block 110 is configured to generate the transmit signal 105 for transmission, in one instance, and in another instance, the signal processing block 110 is configured to process the transmit signal 105, received via the Tx coupler 114, in order to increase the linearity of the power amplifier (PA) 126. In some embodiments, the signal processing block 110 can comprise a digital pre-distortion (DPD) filter (not shown) configured to provide pre-distortion to the transmit chain 103, in order to increase the linearity of the power amplifier (PA) 126. In some embodiments, coefficients of the digital pre-distortion filter is dynamically adjusted based on the transmit signal 105 (coupled via the Tx coupler 114), in accordance with a DPD algorithm.

Figure 2:
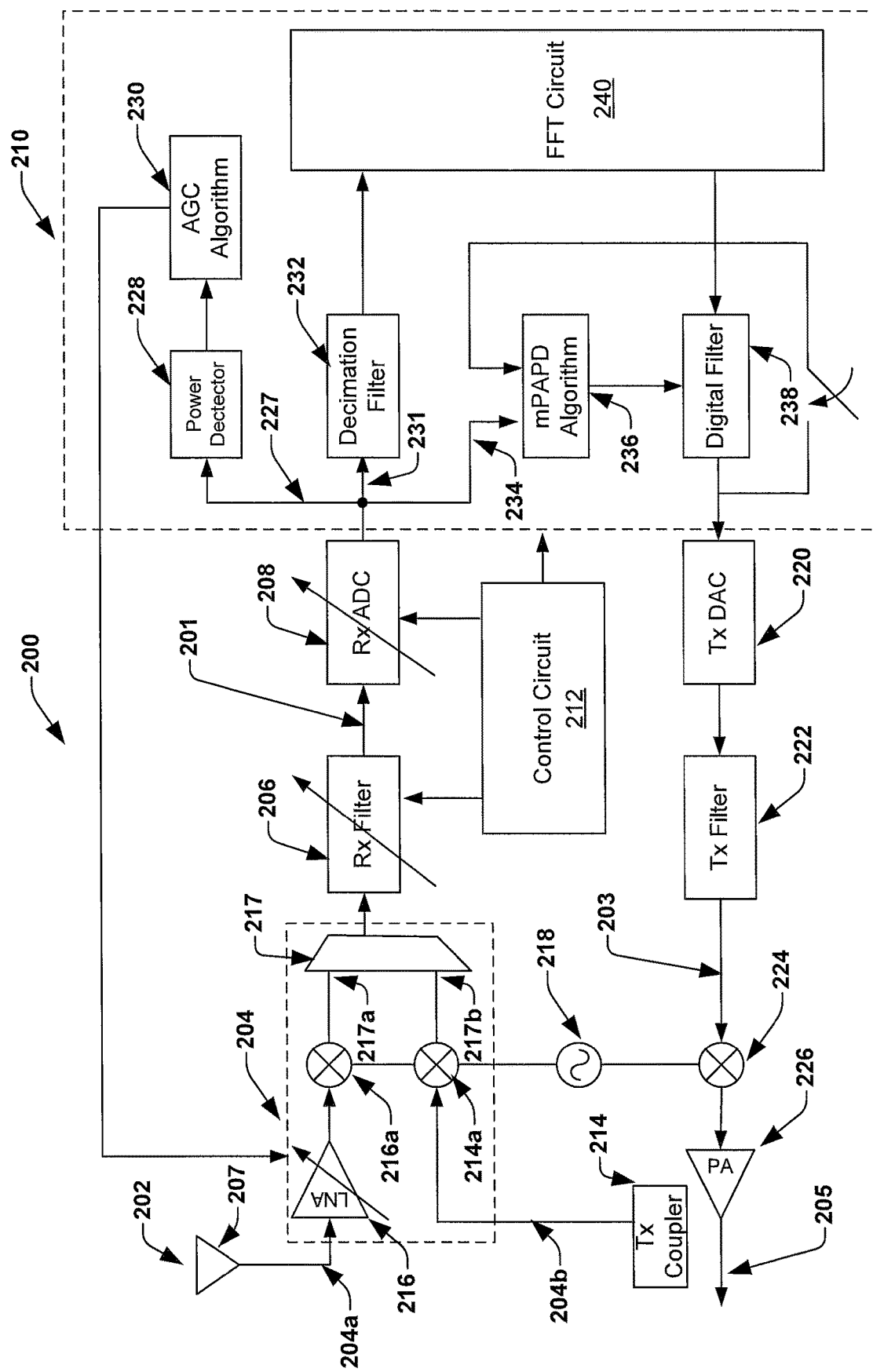
FIG. 2 illustrates an example implementation of a WiFi transceiver, according to one embodiment of the disclosure.

FIG. 2 illustrates an example implementation of a WiFi transceiver 200, according to one embodiment of the disclosure. In some embodiments, the WiFi transceiver 200 is similar to the WiFi transceiver 100 in FIG. 1. The WiFi transceiver 200 comprises a receive chain 201 configured to receive a receive signal 202 during a receive mode of operation, and a transmit chain 203 configured to transmit a transmit signal 205 during a transmit mode of operation. In some embodiments, the receive chain 201 is further configured to receive the transmit signal 205, via a transmit (Tx) coupler 204, during the transmit mode of operation. In some embodiments, the receive chain 201 has a receive bandwidth associated therewith, during the receive mode of operation and in other embodiments, the receive chain 201 has a transmit bandwidth associated therewith, during the transmit mode of operation. In some embodiments, the transmit bandwidth is different from the receive bandwidth. For example, in some embodiments, the transmit bandwidth is greater than the receive bandwidth or vice versa.

The receive chain 201 comprises a receive front end circuit 204, a programmable Rx filter 206 and a programmable Rx ADC 208. In some embodiments, the WiFi transceiver 200 further comprises a control circuit 212 configured to dynamically change a bandwidth associated with the programmable Rx filter 206 and the programmable Rx ADC 208 to the receive bandwidth, during the receive mode of operation, and to the transmit bandwidth, during the transmit mode of operation. In some embodiments, the programmable Rx filter 206 can be implemented using any standard filter technologies. In some embodiments, the Rx ADC 208 is implemented using sigma-delta ADC, however, in other embodiments, other types of variable bandwidth ADCs can also be utilized. In some embodiments, a bandwidth of the sigma-delta ADC is adjusted based on modifying a signal transfer function (STF) and a noise transfer function (NTF) associated with the sigma-delta ADC, the details of which are given in embodiments below. In some embodiments, the transmit chain 203 comprises a Tx DAC 220, a Tx filter 222, a Tx mixer 224 and a power amplifier 226. In some embodiments, the WiFi transceiver 200 further comprises a signal processing block 210 configured to process signals associated with the receive chain 201 and the transmit chain 203.

In some embodiments, the receive front end circuit 204 comprises a first input path 204a coupled to a receive antenna 207 configured to receive the receive signal 202 during the receive mode of operation. In some embodiments, the first signal path 204a comprises a low-noise amplifier (LNA) 216 configured to amplify the receive signal 202 and a first mixer 216a configured to down convert the receive signal 202 to an intermediate frequency. In some embodiments, the receive front end circuit 204 further comprises a second input path 204b coupled to the Tx coupler 214, in order to receive the transmit signal 205 during the transmit mode of operation. In some embodiments, the second input path 204b comprises a second mixer 214a configured to down convert the transmit signal 205 to an intermediate frequency. In some embodiments, the receive front end circuit 204 further comprises a multiplexer circuit 217 coupled to the first input path 204a and to the second input path 204b and configured to provide the receive signal 202 from the first input path 204a to the programmable Rx filter 206 and to the programmable Rx ADC 208 during the receive mode of operation, and provide the transmit signal 205 to the programmable Rx filter 206 and to the programmable Rx ADC 208, during the transmit mode of operation. In some embodiments, the first input path 204a is coupled to a first input 217a of the multiplexer circuit 217 and the second input path 204b is coupled to a second input 217b of the multiplexer circuit 217. In some embodiments, the WiFi receiver 200 further comprises a local oscillator (LO) circuit 218 configured to generate an LO signal for the first mixer 216a and the second mixer 214a. In some embodiments, the LO circuit 218 comprises one or more LO circuits configured to generate respective LO signals for the first mixer 216a and the second mixer 214a, respectively.

During the receive mode of operation, in some embodiments, the signal processing block 210 is configured to process the receive signal 202 from the antenna 207 in one instance, and in another instance, the signal processing block 210 is configured to set an optimal gain of the receive chain 201 based on a power of the receive signal 202. During the transmit mode of operation, the signal processing block 210 is configured to generate the transmit signal 205 for transmission, in one instance, and in another instance, the signal processing block 210 is configured to process the transmit signal 205, received via the Tx coupler 214, in order to increase the linearity of the power amplifier (PA) 126. In order to achieve these functions, the signal processing block 210 comprises an FFT block 240, and a first output path 231, a second output path 227 and a third output path 234, coupled to an output of the Rx ADC 208 in the receive chain 201. For example, in such embodiments, the receive chain 201 is coupled to the first output path 231 via, the output the programmable Rx ADC 208. In some embodiments, the first output path 231 comprises a decimation filter 232 configured to filter the receive signal 202 during the receive mode of operation. In some embodiments, the output of the decimation filter is coupled to the FFT circuit 240, in order to further process the receive signal 202 during the receive mode of operation.

In some embodiments, the receive chain 201 is further coupled to the second output path 227 via, the output the programmable Rx ADC 208. In some embodiments, the second output path 227 comprises a power detector circuit 228 configured to determine a power of the receive signal 202, in order to set the optimal gain of the receive chain 201.

In some embodiments, setting the optimal gain of the receive chain 201 comprises adjusting a gain of the LNA 216, based on the measured receive power at the power detector circuit 228, in accordance with an automatic gain control (AGC) algorithm 230. In some embodiments, the receive chain 201 is further coupled to the third output path 234 via the output the programmable Rx ADC 208. In some embodiments, the third output path 234 comprises a digital pre-distortion (DPD) filter 238 configured to provide pre-distortion to the transmit chain 203, in order to increase the linearity of the power amplifier (PA) 226. In some embodiments, coefficients of the digital pre-distortion filter 238 is dynamically adjusted based on the transmit signal 205 (coupled via the Tx coupler 214), in accordance with a DPD algorithm 236. In some embodiments, the transmit signal 205 generated at the FFT circuit 240 is provided to the DPD filter 238, prior to transmitting the transmit signal 205 via the PA 226.

In some embodiments, the control circuit 212 is configured to selectively activate/de-activate the first output path 231, the second output path 227 and the third output path 234, and/or the circuitry associated therewith, based on the mode of operation of the WiFi transceiver 200. For example, during the receive mode of operation, the control circuit 212 is configured to activate the first output path 231 and the second output path 227, and deactivate the third output path 234 of the signal processing block 210. Similarly, during the transmit mode of operation, the control circuit 212 is configured to activate the third output path 234, and deactivate the first output path 231 and the second output path 227 of the signal processing block 210. In some embodiments, activating/deactivating the first output path 231, the second output path 227 and the third output path 234 comprises activating/deactivating the circuitry associated therewith.

In some embodiments, the circuitry associated with the second output path 227 is configured to adjust the gain of the LNA 216, only at predetermined intervals, during the receive mode of operation. For example, in some embodiments, the control circuit 212 is configured to adjust the gain of the LNA 216 only at the beginning of the receive mode of operation (e.g., during a period during which a preamble associated with the receive signal 202 is obtained) or at predetermined intervals during the receive mode of operation. However, in other embodiments, the control circuit 212 can be configured to adjust the gain of the LNA 216 on a continuous basis. Similarly, during the transmit mode of operation, in some embodiments, the control circuit 212 is configured to adapt (e.g., to activate) the third output path 234 to adjust the coefficients of the DPD filter 238, based on system conditions, for example, temperature of the WiFi transceiver 200, or at predetermined time intervals.

Figure 3:
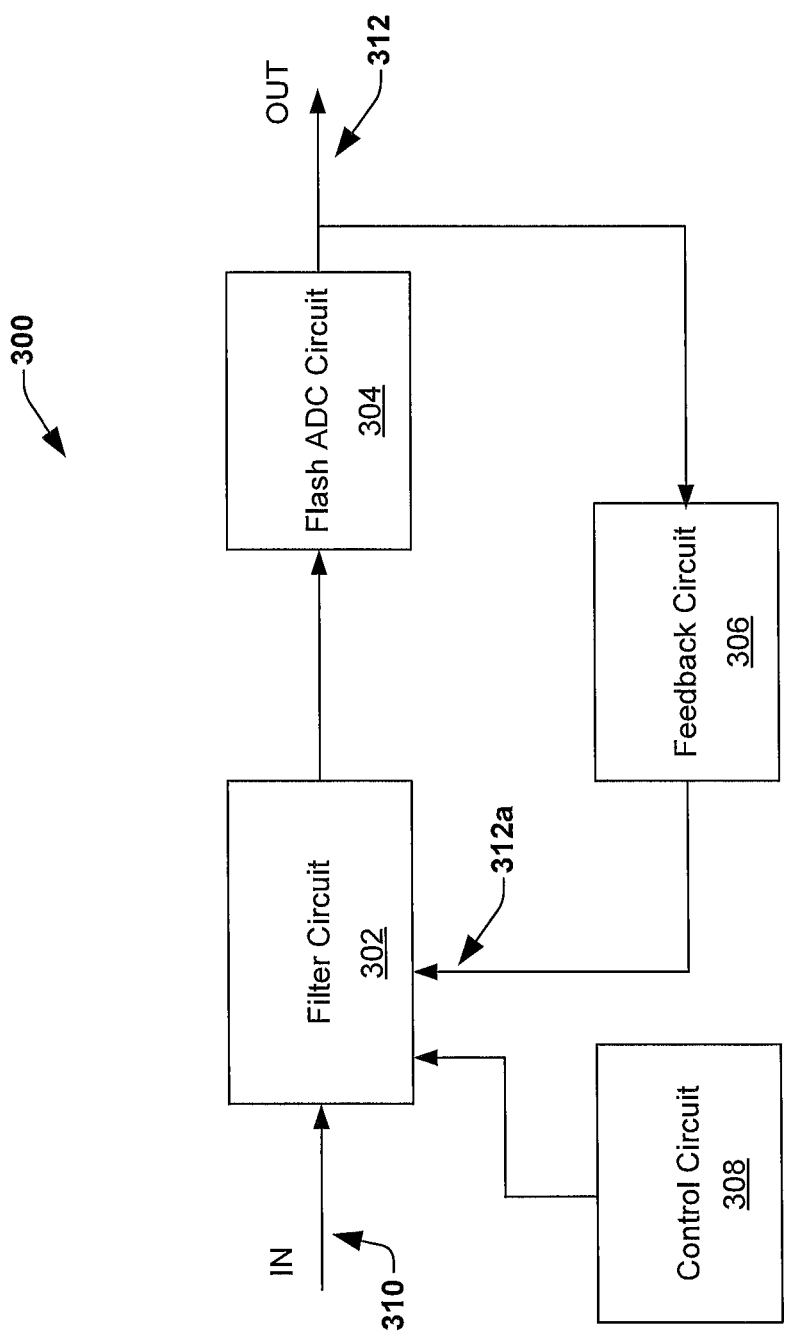
FIG. 3 illustrates a simplified block diagram a sigma-delta ADC having variable bandwidth, according to one embodiment of the disclosure.

FIG. 3 illustrates a simplified block diagram of a sigma-delta ADC 300 having variable bandwidth, according to one embodiment of the disclosure. In some embodiments, the sigma-delta ADC 300 can be implemented as the Rx ADC 208 in FIG. 2. The sigma-delta ADC 300 is explained herein with reference to the Rx ADC 208 in FIG. 2. The sigma-delta ADC 300 comprises a filter circuit 302, a flash ADC circuit 304 and a feedback circuit 306. In some embodiments, the sigma-delta ADC 300 further comprises an ADC control circuit 308 coupled to the filter circuit 302, in order to adjust a bandwidth of the sigma-delta ADC 300, according to a mode of operation of the sigma-delta ADC 300. In the embodiments in which the sigma-delta ADC 300 is implemented as the Rx ADC 208 in FIG. 2, the ADC control circuit 308 can be part of the control circuit 212 in FIG. 2. Alternately, the sigma-delta ADC 300 can have a dedicated control circuit 308, different from the control circuit 212 in FIG. 2. Further, in such embodiments, the mode of operation of the sigma-delta ADC 300 is associated with the mode of operation of the WiFi transceiver 200 in FIG. 2, and therefore, the ADC control circuit 308 is configured to adjust the bandwidth of the sigma-delta ADC 300 to the receive bandwidth of the WiFi transceiver 200, during the receive mode of operation of the WiFi transceiver 200, and to the transmit bandwidth of the WiFi transceiver 200, during the transmit mode of operation of the WiFi transceiver 200.

In some embodiments, the filter circuit 302 is configured to receive an analog input signal 310 (e.g., the receive signal 202 or the transmit signal 205 associated with the receive chain 201 of the WiFi transceiver 200 in FIG. 2) and filter the analog input signal 310. In some embodiments, the filter circuit 302 can comprise a plurality of filter circuits (not shown) in cascade. In some embodiments, the flash ADC circuit 304 is coupled to the output of the filter circuit 302 and is configured to generate a digital output signal 312, based on quantization of the output of the filter circuit 302. In some embodiments, the feedback circuit 306 is coupled to the output of the flash ADC circuit 304 and comprises a feedback path configured to feedback the digital output signal 312, for example, a feedback signal 312a, to the filter circuit 302. In some embodiments, the feedback circuit 306 further comprises a digital-to-analog converter (DAC) circuit (not shown) associated therewith, coupled to the feedback path. In some embodiments, feeding back the digital output signal 312 has the effect of noise shaping an error (e.g., quantization error or white noise) due to the flash ADC circuit 304, so that the noise associated with the flash ADC circuit 304 does not appear in the desired signal frequencies at the output of the sigma delta ADC 300. In some embodiments, the feedback circuit 306 can comprise a plurality of feedback paths, respectively associated with the plurality of filter stages of the filter circuit 302, each feedback path having a respective DAC circuit associated therewith (not shown).

In some embodiments, the sigma-delta ADC 300 (i.e., the filter circuit 302, the flash ADC circuit 304 and the feedback circuit 306) comprises a signal transfer function (STF) and a noise transfer function (NTF) associated therewith. In some embodiments, the STF defines a relation between the analog input signal 310 and the digital output signal 312 of the sigma delta ADC 300, and the NTF defines a relation between the feedback signal 312a and the digital output signal 312 of the sigma-delta ADC 300. In some embodiments, the bandwidth of the sigma-delta ADC 300 is adjusted based on modifying the STF and the NTF associated with the sigma-delta ADC 300. In some embodiments, modifying the STF and the NTF of the sigma-delta ADC 300 enables the sigma-delta ADC 300 to achieve the required bandwidth and performances in all modes of operation. In some embodiments, the STF and the NTF of the sigma-delta ADC 300 can be adjusted by modifying a topology of the filter circuit 302. Therefore, in such embodiments, the control circuit 308 is configured to modify the topology of the filter circuit 302, based on the mode of operation of the sigma-delta ADC 300 (or the mode of operation of the WiFi transceiver 200 in FIG. 2).

Figure 4:
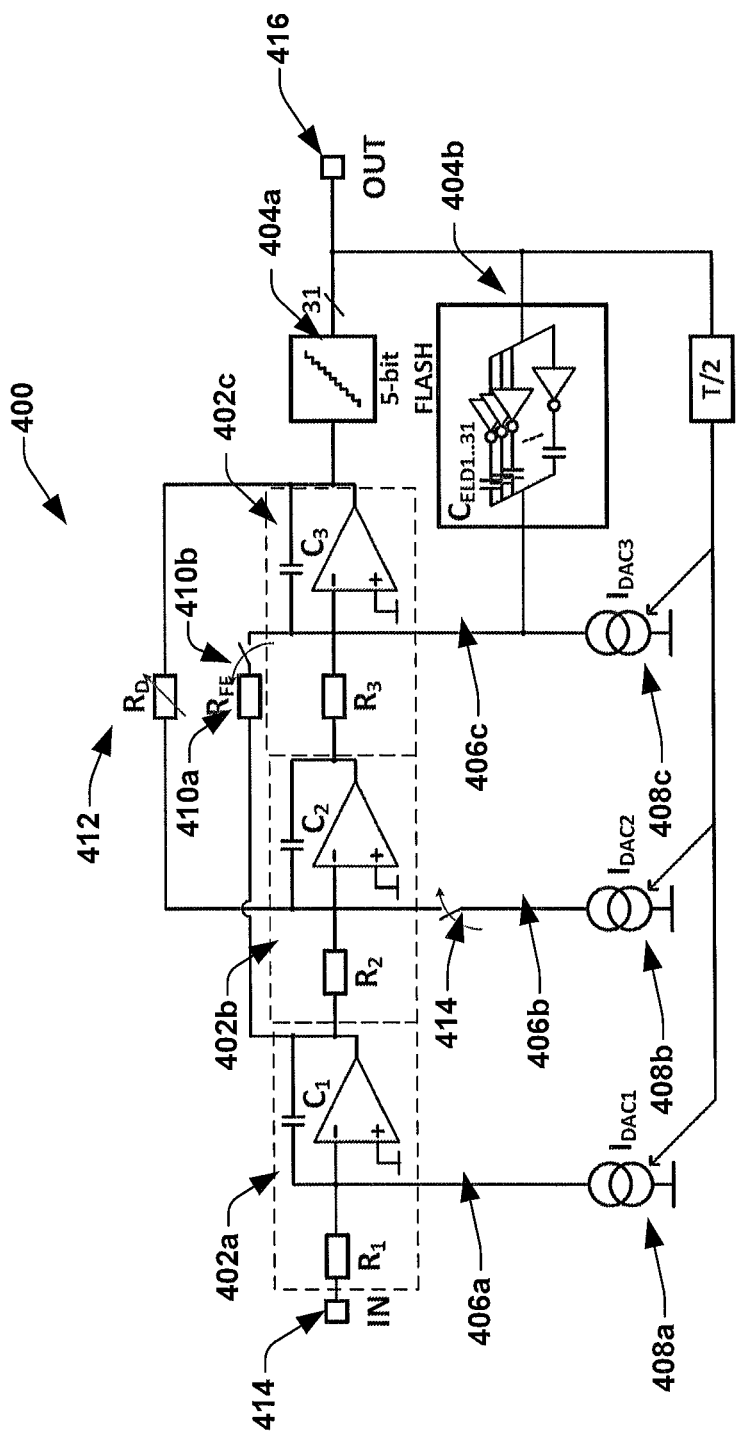
FIG. 4 illustrates an example implementation of a sigma-delta ADC having variable bandwidth, according to one embodiment of the disclosure.

FIG. 4 illustrates an example implementation of a sigma-delta ADC 400 having variable bandwidth, according to one embodiment of the disclosure. In some embodiments, the sigma-delta ADC 400 depicts one possible way of implementation of the sigma-delta ADC 300 in FIG. 3. However, in other embodiments, other implementations of the sigma-delta ADC 300 is also possible. The sigma-delta ADC 400 is explained herein with reference to the Rx ADC 208 in FIG. 2 and the sigma-delta ADC 300 in FIG. 3. The sigma-delta ADC 400 comprises an input signal path configured to receive an analog input signal 414 and comprising a first filter circuit 402a, a second filter circuit 402b and a third filter circuit 402c comprising a filter circuit (e.g., the filter circuit 302 in FIG. 3) associated therewith, configured to filter the analog input signal 414. In this example embodiments, the sigma-delta ADC 400 comprises 3 filter circuits in cascade, however, in other embodiments, the number of filter circuits can be different. The sigma-delta ADC 400 further comprises elements 404a and 404b comprising a flash ADC circuit (e.g., the flash ADC circuit 304 in FIG. 3) coupled to the output of the third filter circuit 402c, configured to generate a digital output signal 416, based on the output of the filter circuit. In addition, the sigma-delta ADC 400 comprises a first feedback path 406a associated with the first filter circuit 402a, a second feedback path 406b associated with the second filter circuit 402b and a third feedback path 406c associated with the third filter circuit 402c comprising a feedback circuit (e.g., the feedback circuit 306 in FIG. 2).

In some embodiments, the first feedback path 406a comprises a first digital-to-analog converter (DAC) circuit 408a, the second feedback path 406b comprises a second DAC circuit 408b and the third feedback path 406c comprises a third DAC circuit 408c, respectively associated therewith. In the embodiments in which the sigma-delta ADC 400 is implemented as the Rx ADC 208 in FIG. 2, a signal transfer function (STF) and a noise transfer function (NTF) of the sigma-delta ADC 400 is varied in order to vary a bandwidth associated with the sigma-delta ADC 400, in accordance with a mode of operation of the WiFi transceiver 200 in FIG. 2. In order to vary the STF and NTF of the sigma-delta ADC 400, in some embodiments, a topology of the filter circuit comprising the first filter circuit 402a, the second filter circuit 402b and the third filter circuit 402c is modified, in accordance with the required bandwidth of operation.

In some embodiments, in order to facilitate varying the STF and the NTF of the sigma-delta ADC 400, a resistor RFF 410a and a resistor RD 412 is included as part of the filter circuit. The position and a count of the resistor RFF 410a and the resistor RD 412 can be different in other embodiments, depending on the number of filter circuits. For example, in this embodiment, an STF of the sigma-delta ADC 400 is varied by opening the switch 414 and closing the switch 410b, thereby including the resistor RFF 410a in the signal path. In some embodiments, opening the switch 414 enables to bypass the second filter circuit 402b from the input signal path of the analog input signal 414. Similarly, in this embodiment, the NTF of the sigma-delta ADC 400 is varied by programming the resistor RD 412. In some embodiments, the sigma-delta ADC 400 further comprises a control circuit (not shown) associated therewith, in order to vary the STF and NTF of the sigma-delta ADC 400. In some embodiments, the sigma-delta ADC 400 can have a dedicated control circuit (as in FIG. 3 above) or as part of the control circuit 212 in FIG. 2 above.

Figure 5:
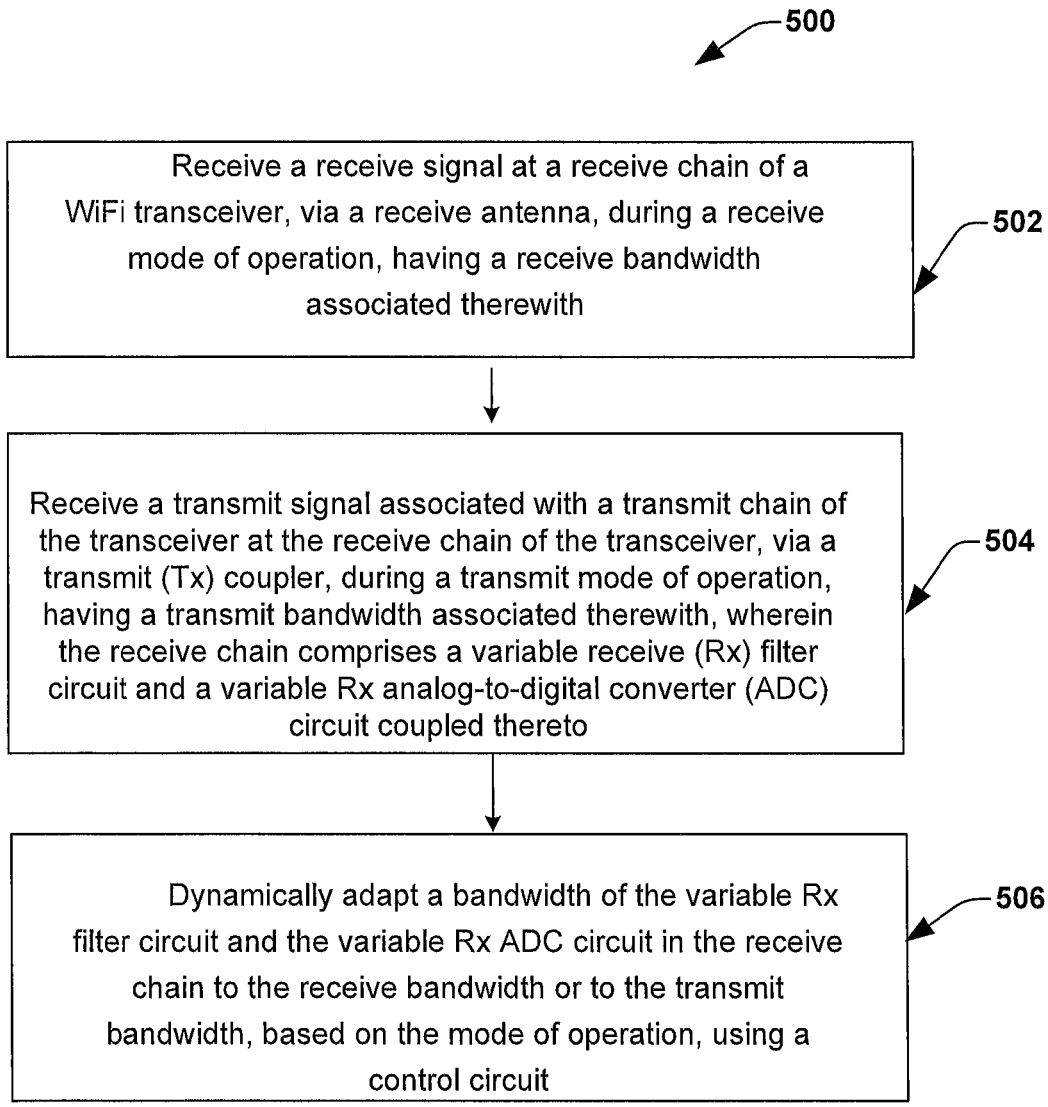
FIG. 5 illustrates a flow chart of a method for a WiFi receiver, according to one embodiment of the disclosure.

FIG. 5 illustrates a flow chart of a method 500 for a WiFi receiver, according to one embodiment of the disclosure. The method 500 is explained herein with respect to the WiFi receiver 200 in FIG. 2. At 502, a receive signal is received at a receive chain (e.g., the receive chain 201) of a WiFi transceiver (e.g., WiFi transceiver 200), via a receive antenna (e.g., the receive antenna 207), during a receive mode of operation, having a receive bandwidth associated therewith. At 504, a transmit signal associated with a transmit chain (e.g., the transmit chain 203) of the transceiver (e.g., the WiFi transceiver 200) at the receive chain of the transceiver, via a transmit (Tx) coupler (e.g., the Tx coupler 214), during a transmit mode of operation, having a transmit bandwidth associated therewith. In some embodiments, the receive chain comprises a variable receive (Rx) filter circuit (e.g., Rx filter 206) and a variable Rx analog-to-digital converter (ADC) circuit (e.g., the Rx ADC 208) coupled thereto. At 506, a bandwidth of the variable Rx filter circuit and the variable Rx ADC circuit in the receive chain is dynamically adapted to the receive bandwidth or to the transmit bandwidth, based on the mode of operation, using a control circuit (e.g., the control circuit 212).

While the methods are illustrated and described above as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

While the apparatus has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a WiFi transceiver comprising a receive chain comprising a variable receive (Rx) filter circuit and a variable Rx analog-to-digital converter (ADC) circuit, wherein the receive chain is configured to receive a receive signal during a receive mode of operation, having a receive bandwidth associated therewith; and receive a transmit signal associated with a transmit chain of the transceiver during a transmit mode of operation, having a transmit bandwidth associated therewith; a control circuit configured to dynamically adapt a bandwidth of the variable Rx filter and the variable Rx ADC in the receive chain to one of the receive bandwidth and the transmit bandwidth, based on the mode of operation.

Example 2 is a transceiver, including the subject matter of example 1, wherein the receive chain further comprises a receiver front end circuit coupled to an input of the variable Rx filter circuit, the receiver front end circuit comprising a multiplexer circuit configured to selectively provide the receive signal or the transmit signal to the input of the variable Rx filter circuit, based on the mode of operation.

Example 3 is a transceiver, including the subject matter of examples 1-2, including or omitting elements, wherein the receive front end circuit further comprises a first input path comprising a low noise amplifier (LNA) circuit, coupled to a first input of the multiplexer circuit and configured to receive the receive signal, during the receive mode of operation.

Example 4 is a transceiver, including the subject matter of examples 1-3, including or omitting elements, wherein the receive front end circuit further comprises a second input path comprising a transmit (Tx) coupler circuit, coupled to a second, different input of the multiplexer circuit and configured to receive the transmit signal from the transmit chain, during the transmit mode of operation.

Example 5 is a transceiver, including the subject matter of examples 1-4, including or omitting elements, wherein the receive chain further comprises a decimation filter coupled to an output of the variable Rx ADC circuit in a first output path associated therewith and configured to filter the receive signal, during the receive mode of operation.

Example 6 is a transceiver, including the subject matter of examples 1-5, including or omitting elements, wherein the receive chain further comprises a power detector circuit coupled to the output of the variable Rx ADC circuit in a second, different output path associated therewith, wherein the power detector circuit is configured to measure a power associated with the receive chain, in order to set an optimal gain for the receive chain, in accordance with a predetermined gain control, during the receive mode of operation.

Example 7 is a transceiver, including the subject matter of examples 1-6, including or omitting elements, wherein the receiver chain further comprises a digital pre-distortion (DPD) calibration circuit coupled to the output of the Rx ADC circuit in a third, different output path associated therewith, wherein the DPD calibration circuit is configured to adjust coefficients of a digital filter in the transmit chain in order to increase the efficiency of a power amplifier in the transmit chain, based on the received transmit signal in accordance with a predetermined algorithm, during the transmit mode of operation.

Example 8 is a transceiver, including the subject matter of examples 1-7, including or omitting elements, wherein the control circuit is further configured to deactivate the first output path and the second output path associated with the receive chain during the transmit mode of operation, and deactivate the third output path associated with the receive chain, during the receive mode of operation.

Example 9 is a transceiver, including the subject matter of examples 1-8, including or omitting elements, wherein the variable Rx ADC circuit comprises a sigma delta ADC, having a signal transfer function (STF) and a noise transfer function (NTF) associated therewith.

Example 10 is a transceiver, including the subject matter of examples 1-9, including or omitting elements, wherein the control circuit is configured to adapt the bandwidth of the variable Rx ADC circuit by dynamically adjusting the STF and NTF of the sigma delta ADC, based on the mode of operation.

Example 11 is an analog-to-digital converter (ADC) in a receive chain of a WiFi transceiver, comprising a filter circuit configured to receive and filter an analog input signal associated with the receive chain of the WiFi transceiver; a flash ADC circuit coupled to an output of the filter circuit and configured to generate a digital output signal based on the analog input signal; a feedback circuit coupled to the output of the flash ADC circuit and configured to feed back the digital output signal to a feedback path associated with the filter circuit, wherein the filter circuit, the flash ADC circuit and the feedback circuit together has a signal transfer function (STF) and a noise transfer function (NTF) associated therewith; and an ADC control circuit configured to adjust at least one of the STF and NTF, based on a first mode of operation and a second, different mode of operation of the ADC.

Example 12 is an ADC, including the subject matter of example 11, wherein the first mode of operation comprises a first bandwidth associated therewith and the second mode of operation comprises a second different bandwidth associated therewith.

Example 13 is an ADC, including the subject matter of examples 11-12, including or omitting elements, wherein adjusting the STF and NTF comprises dynamically modifying a topology of the filter circuit, in accordance with the required bandwidth of operation of the ADC.

Example 14 is an ADC, including the subject matter of examples 11-13, including or omitting elements, wherein the filter circuit comprises one or more filter stages, each having a feedback path associated therewith.

Example 15 is an ADC, including the subject matter of examples 11-14, including or omitting elements, wherein the feedback circuit comprises one or more digital-to-analog converter (DAC) circuits coupled to the respective feedback paths associated with the one or more filter stages.

Example 16 is an ADC, including the subject matter of examples 11-15, including or omitting elements, wherein the analog input signal comprises a receive signal associated with the WiFi transceiver, during a receive mode of operation of the WiFi transceiver, and wherein the analog input signal comprises a transmit signal associated with the WiFi transceiver, during a transmit mode of operation of the WiFi transceiver.

Example 17 is an ADC, including the subject matter of examples 11-16, including or omitting elements, wherein the first mode of operation of the ADC is associated with a receive mode of operation of the WiFi transceiver, and the second mode of operation of the ADC is associated with a transmit mode of operation of the WiFi transceiver.

Example 18 is a method for a WiFi transceiver, comprising receiving a receive signal at a receive chain of the transceiver, via a receive antenna, during a receive mode of operation, having a receive bandwidth associated therewith; receiving a transmit signal associated with a transmit chain of the transceiver at the receive chain of the transceiver, via a transmit (Tx) coupler, during a transmit mode of operation, having a transmit bandwidth associated therewith, wherein the receive chain comprises a variable receive (Rx) filter circuit and a variable Rx analog-to-digital converter (ADC) circuit coupled thereto; and dynamically adapting a bandwidth of the variable Rx filter circuit and the variable Rx ADC circuit in the receive chain to the receive bandwidth or to the transmit bandwidth, based on the mode of operation, using a control circuit.

Example 19 is a method, including the subject matter of example 18, further comprising filtering the receive signal at a decimation filter circuit coupled to an output of the Rx ADC circuit in a first output path associated therewith, during the receive mode of operation.

Example 20 is a method, including the subject matter of examples 18-19, including or omitting elements, further comprising measuring a power associated with the receive chain, at a power detector circuit coupled to the output of the variable Rx ADC circuit in a second, different output path associated therewith, in order to set an optimal gain for the receive chain, based on a predetermined algorithm, during the receive mode of operation.

Example 21 is a method, including the subject matter of examples 18-20, including or omitting elements, further comprising adjusting coefficients of a digital filter in the transmit chain, based on the received transmit signal in accordance with a predetermined algorithm using a digital pre-distortion (DPD) calibration circuit coupled to the output of the Rx ADC circuit in a third, different output path associated therewith, in order to increase the efficiency of a power amplifier in the transmit chain, during the transmit mode of operation.

Example 22 is a method, including the subject matter of examples 18-21, including or omitting elements, wherein the variable Rx ADC circuit comprises a sigma delta ADC and dynamically adapting the bandwidth of the variable Rx ADC circuit comprises adjusting a signal transfer function (STF) and a noise transfer function (NTF) associated with the sigma delta ADC.

Various illustrative logics, logical blocks, modules, and circuits described in connection with aspects disclosed herein can be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A WiFi transceiver comprising:
   a receive chain comprising a variable receive (Rx) filter circuit and a variable Rx analog-to-digital converter (ADC) circuit, wherein the receive chain is configured to:
   receive a receive signal during a receive mode of operation, having a receive bandwidth associated therewith; and
   receive a transmit signal associated with a transmit chain of the transceiver during a transmit mode of operation, having a transmit bandwidth associated therewith; and
   a control circuit configured to dynamically adapt a bandwidth of the variable Rx filter and the variable Rx ADC in the receive chain to one of the receive bandwidth and the transmit bandwidth, based on the mode of operation.

2. The transceiver of claim 1, wherein the receive chain further comprises a receiver front end circuit coupled to an input of the variable Rx filter circuit, the receiver front end circuit comprising a multiplexer circuit configured to selectively provide the receive signal or the transmit signal to the input of the variable Rx filter circuit, based on the mode of operation.

3. The transceiver of claim 2, wherein the receive front end circuit further comprises a first input path comprising a low noise amplifier (LNA) circuit, coupled to a first input of the multiplexer circuit and configured to receive the receive signal, during the receive mode of operation.

4. The transceiver of claim 2, wherein the receive front end circuit further comprises a second input path comprising a transmit (Tx) coupler circuit, coupled to a second, different input of the multiplexer circuit and configured to receive the transmit signal from the transmit chain, during the transmit mode of operation.

5. The transceiver of claim 1, wherein the receive chain further comprises a decimation filter coupled to an output of the variable Rx ADC circuit in a first output path associated therewith and configured to filter the receive signal, during the receive mode of operation.

6. The transceiver of claim 5, wherein the receive chain further comprises a power detector circuit coupled to the output of the variable Rx ADC circuit in a second, different output path associated therewith, wherein the power detector circuit is configured to measure a power associated with the receive chain, in order to set an optimal gain for the receive chain, in accordance with a predetermined gain control, during the receive mode of operation.

7. The transceiver of claim 6, wherein the receiver chain further comprises a digital pre-distortion (DPD) calibration circuit coupled to the output of the Rx ADC circuit in a third, different output path associated therewith, wherein the DPD calibration circuit is configured to adjust coefficients of a digital filter in the transmit chain in order to increase the efficiency of a power amplifier in the transmit chain, based on the received transmit signal in accordance with a predetermined algorithm, during the transmit mode of operation.

8. The transceiver of claim 7, wherein the control circuit is further configured to deactivate the first output path and the second output path associated with the receive chain during the transmit mode of operation, and deactivate the third output path associated with the receive chain, during the receive mode of operation.

9. The transceiver of claim 1, wherein the variable Rx ADC circuit comprises a sigma delta ADC, having a signal transfer function (STF) and a noise transfer function (NTF) associated therewith.

10. The transceiver of claim 9, wherein the control circuit is configured to adapt the bandwidth of the variable Rx ADC circuit by dynamically adjusting the STF and NTF of the sigma delta ADC, based on the mode of operation.

11. A method for a WiFi transceiver, comprising:
receiving a receive signal at a receive chain of the transceiver, via a receive antenna, during a receive mode of operation, having a receive bandwidth associated therewith;
receiving a transmit signal associated with a transmit chain of the transceiver at the receive chain of the transceiver, via a transmit (Tx) coupler, during a transmit mode of operation, having a transmit bandwidth associated therewith, wherein the receive chain comprises a variable receive (Rx) filter circuit and a variable Rx analog-to-digital converter (ADC) circuit coupled thereto; and
dynamically adapting a bandwidth of the variable Rx filter circuit and the variable Rx ADC circuit in the receive chain to one of the receive bandwidth and the transmit bandwidth, based on the mode of operation, using a control circuit.

12. The method of claim 11, further comprising filtering the receive signal at a decimation filter circuit coupled to an output of the Rx ADC circuit in a first output path associated therewith, during the receive mode of operation.

13. The method of claim 12, further comprising measuring a power associated with the receive chain, at a power detector circuit coupled to the output of the variable Rx ADC circuit in a second, different output path associated therewith, in order to set an optimal gain for the receive chain, based on a predetermined gain control, during the receive mode of operation.

14. The method of claim 13, further comprising adjusting coefficients of a digital filter in the transmit chain, based on the received transmit signal in accordance with a predetermined algorithm using a digital pre-distortion (DPD) calibration circuit coupled to the output of the Rx ADC circuit in a third, different output path associated therewith, in order to increase the efficiency of a power amplifier in the transmit chain, during the transmit mode of operation.

15. The method of claim 11, wherein the variable Rx ADC circuit comprises a sigma delta ADC and dynamically adapting the bandwidth of the variable Rx ADC circuit comprises adjusting a signal transfer function (STF) and a noise transfer function (NTF) associated with the sigma delta ADC.

* * * * *